(12) United States Patent
Brekelmans et al.

(10) Patent No.: US 7,248,107 B2
(45) Date of Patent: Jul. 24, 2007

(54) METHOD OF CONTROLLING A VARIABLE GAIN AMPLIFIER AND ELECTRONIC CIRCUIT

(75) Inventors: Johannes Hubertus Antonius Brekelmans, Eindhoven (NL); Marc Godfriedus Marie Notten, Eindhoven (NL)

(73) Assignee: NXP B.V., Eindhoven (NL)

( * ) Notice: Subject to any disclaimer, the term of this patent is extended or adjusted under 35 U.S.C. 154(b) by 147 days.

(21) Appl. No.: 10/552,817

(22) PCT Filed: Apr. 8, 2004

(86) PCT No.: PCT/IB2004/050415

§ 371 (c)(1),
(2), (4) Date: Oct. 11, 2005

(87) PCT Pub. No.: WO2004/093312

PCT Pub. Date: Oct. 28, 2004

(65) Prior Publication Data

US 2006/0208801 A1 Sep. 21, 2006

(30) Foreign Application Priority Data

Apr. 16, 2003 (EP) .................. 03101041

(51) Int. Cl.
*H03G 3/20* (2006.01)
(52) U.S. Cl. ........................................ 330/86; 330/279
(58) Field of Classification Search ................. 330/86, 330/144; 381/94.5
See application file for complete search history.

(56) References Cited

U.S. PATENT DOCUMENTS

| 4,360,787 A | * | 11/1982 | Galpin ....................... 330/284 |
| 4,675,905 A | * | 6/1987 | Flora et al. .................... 381/81 |
| 4,855,685 A | | 8/1989 | Hochschild |
| 4,888,810 A | * | 12/1989 | Preves ......................... 381/109 |
| 6,931,124 B1 | * | 8/2005 | Rubacha et al. ............ 379/421 |

* cited by examiner

*Primary Examiner*—Steven J. Mottola

(57) ABSTRACT

The present invention relates to a method of controlling a variable gain amplifier having at least one semiconductor switch, the amplifier having a first gain when the semiconductor switch is in a first steady state and a first gate voltage is applied to the semiconductor switch, and the amplifier having a second gain when the semiconductor switch is in a second steady state and a second gate voltage is applied to the semiconductor switch, whereby a sequence of third gate voltages is applied to the semiconductor switch to transition between the first and second gains.

15 Claims, 5 Drawing Sheets

METHOD OF CONTROLLING A VARIABLE GAIN AMPLIFIER AND ELECTRONIC CIRCUIT

Figure 1:
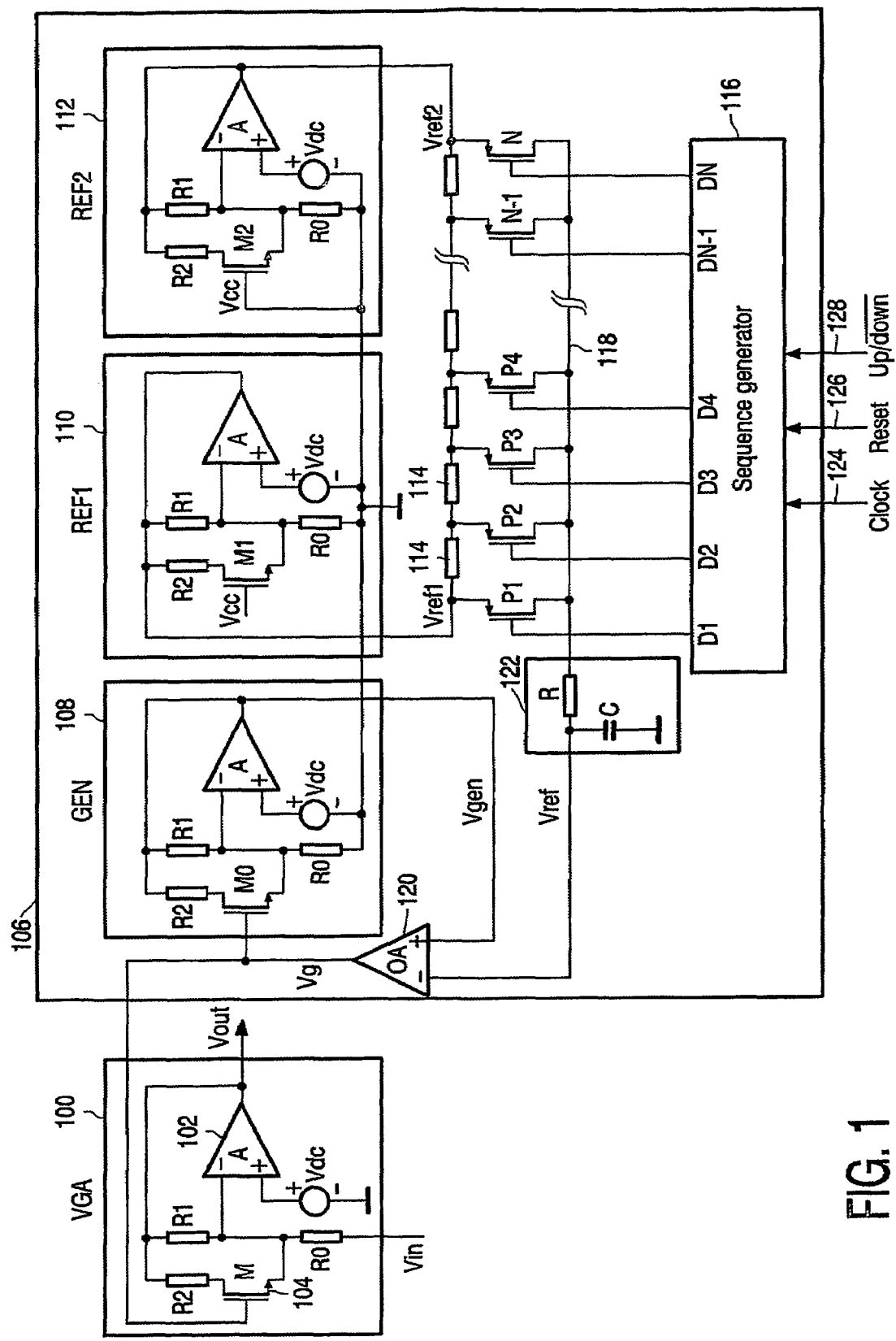

The present invention relates to the field of variable gain amplifiers and, more particularly without limitation, to continuous analogue output amplifiers having a gain that is selectable in discrete steps in conjunction with various switches.

A known type of variable gain amplifier is that utilizing an operational amplifier wherein the gain of the amplifier is determined by the ratio of a feedback resistance to a series resistance. In these types of amplifier circuits the gain can be selected by setting of various switches in the resistor network providing the feedback. For example, U.S. Pat. No. 4,855,685 shows such a precision switchable gain circuit for use as an analogue interface for an analogue to digital converter.

Variable gain amplifiers are also used in television tuners, as part of control loops for automatic gain control (AGC). Prior art tuners use dual gate MOS transistors of which the DC voltage applied to the second gate allows to control the transconductance and thus the gain. In such prior art tuners the gain control is continuous.

Variable gain amplifiers which enable a discrete selection of gains by setting of switches are not useable for such applications as television or radio tuners because an abrupt change of the gain causes a visible or audible signal distortion.

The present invention therefore aims to provide an improved method of controlling a variable gain amplifier in order to reduce the amount distortion during gain transitions.

The invention provides for a method of controlling a variable gain amplifier having at least one semiconductor device to select between first and second gains of the variable gain amplifier. The transition between the gain states of the variable gain amplifier is controlled by applying a sequence of control voltages to the semiconductor device to gradually alter the control voltage of the semiconductor device by means of a stepped sequence.

This way a stepwise transition between the discrete gain states of the variable gain amplifier is accomplished which eliminates transition distortions. This enables the application of variable gain amplifiers having discrete switchable gains to applications such as television and radio tuners.

In accordance with a preferred embodiment of the invention the stepped signal sequence is low pass filtered before being applied to the gate of the semiconductor device which further reduces distortion during the transition phase.

In accordance with a further preferred embodiment of the invention a sub-set of semiconductor switches is used for coarse gain control and another sub-set of switches is used for fine gain control. A desired gain is selected by selecting one or more switches of the first sub-set and by selecting one or more switches of the second sub-set. The selected switches of the first and/or second sub-sets need to be switched on or off.

These switching operations are performed sequentially by gradually switching each one of the selected switches by applying the stepped sequence. In other words, the selected switches are brought into the required switching state one after the other by consecutively applying the stepped sequences to the selected switches. This enables usage of a single sequence generator which can be multiplexed between the switches.

In accordance with a preferred embodiment of the invention a gate voltage generator circuit, and first and second reference voltage circuits are used for the generation of the stepped gate voltage sequence. The gate voltage generator circuit and the first and second reference voltage circuits are electrically equivalent to the variable gain amplifier circuit.

For example the gate voltage of the switch of one of the reference voltage circuits is permanently tied to the supply voltage potential whereas the gate of the other reference voltage circuit is permanently tied to ground. The sequence generator generates a sequence which transitions between the reference voltages provided by the two reference voltage circuits. This stepped voltage sequence is used in order to control the generator circuit which provides the sequence of gate voltages for transitioning the state of the switch of the variable gain amplifier.

In accordance with a further preferred embodiment of the invention an interface circuit is provided between the gate of the switch and the sequence generator. The interface circuit has the purpose of storing and holding of the steady state of the switch. The interface circuit provides a corresponding state signal to the sequence generator in order to inform the sequence generator of the initial state of the switch before a transmission occurs.

When a transition from the steady state to another steady state is triggered, the interface circuit is switched in order to apply the stepped sequence of gate voltages through the gate of the switch. When the transitional sequence has been completed the interface circuit is switched back in order to hold the new steady state.

In accordance with a further preferred embodiment of the invention, distortion is further reduced by modulating the gate voltage of the switch with an alternating currant signal component which is present at the drain of the switch. For example, this drain signal can be coupled to the gate by means of a series connection of a resistor and a capacitor. Preferably the moderating signal amplitude is divided across several switches which further reduces the overall distortion. This way the modulation of the on-resistance of a MOS device is reduced when used as a variable resistor. Thereby non-linearity introduced by the MOS devices is significantly reduced.

Figure 2:
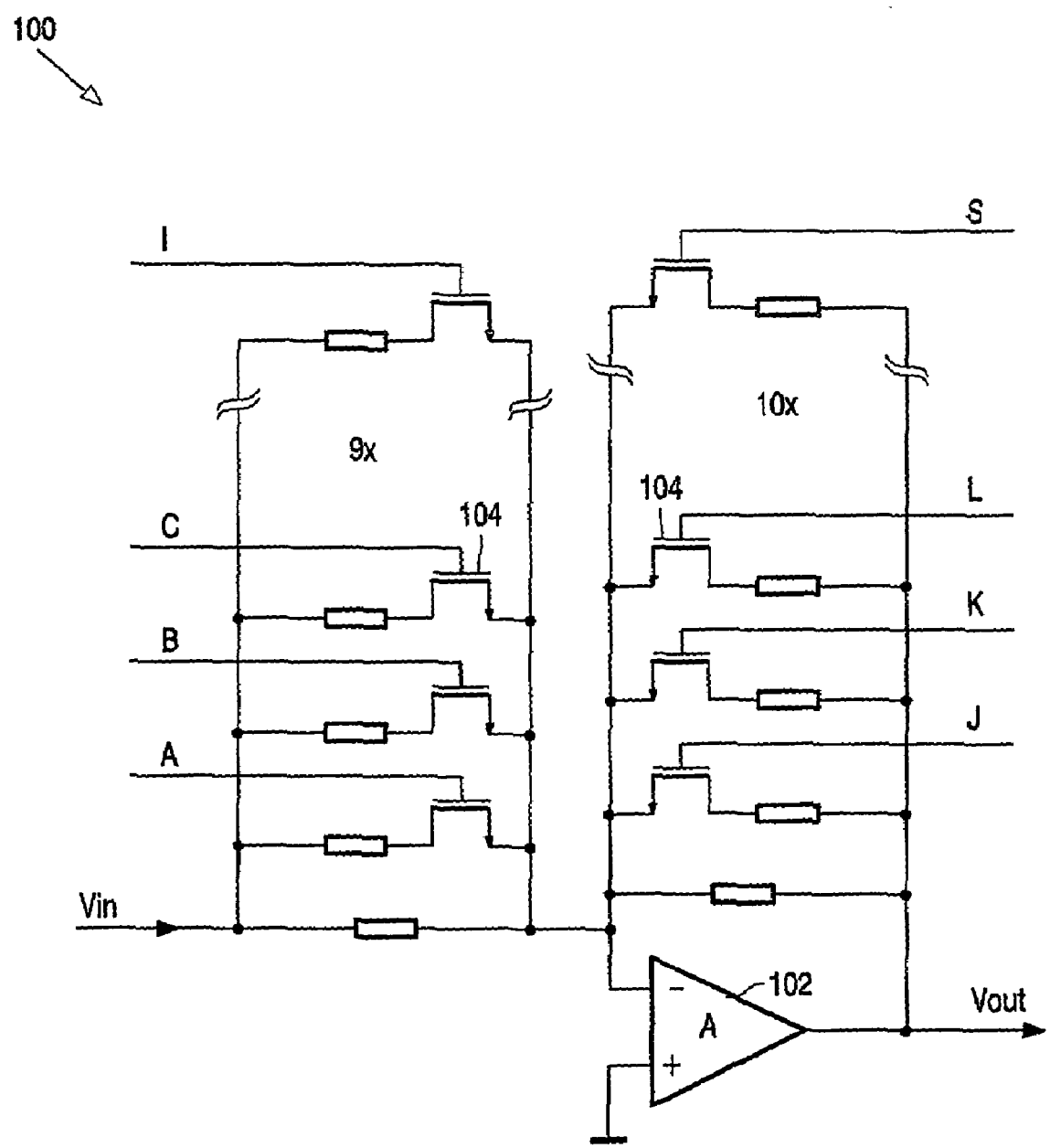
Figure 3:
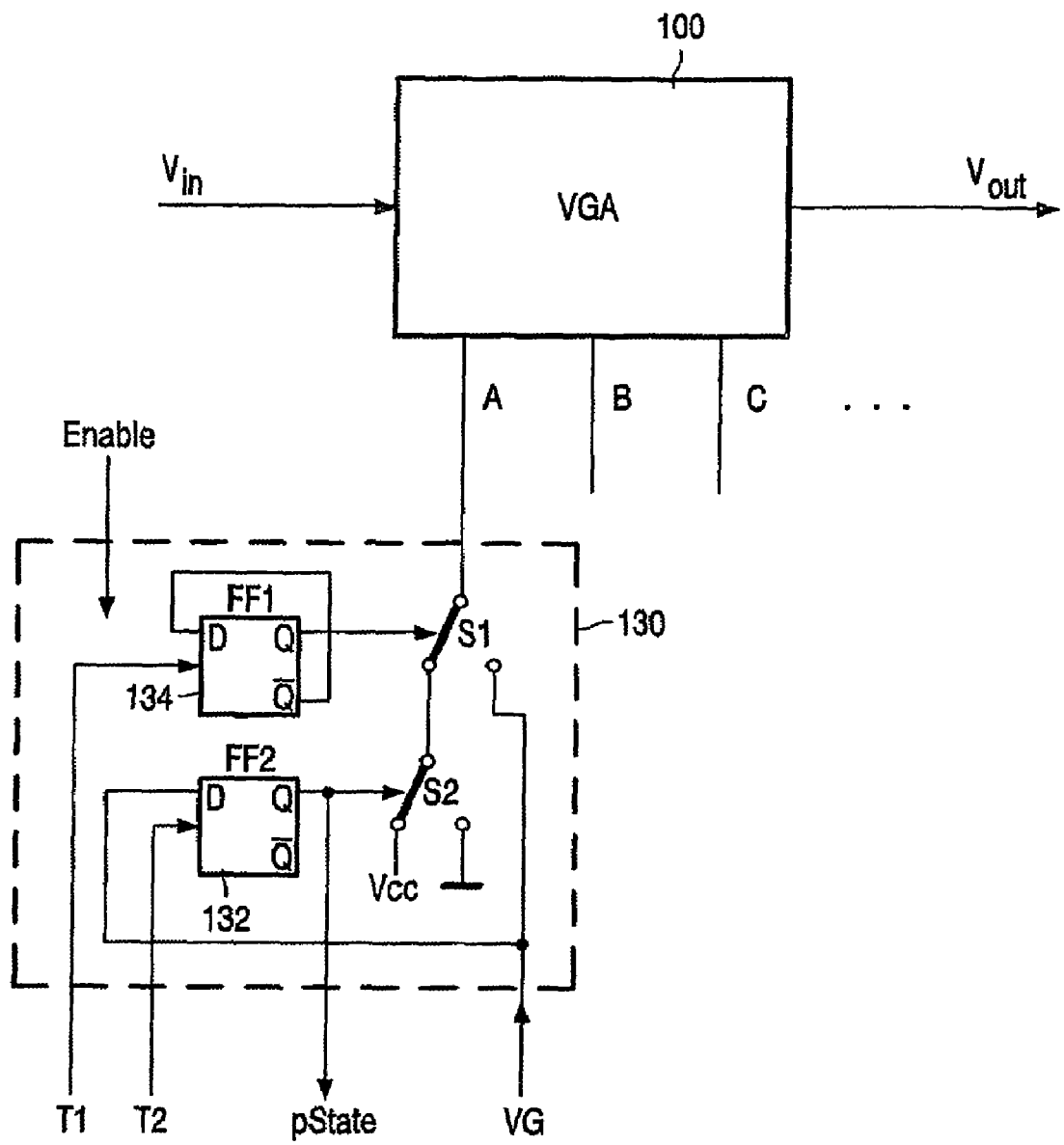
Figure 4:
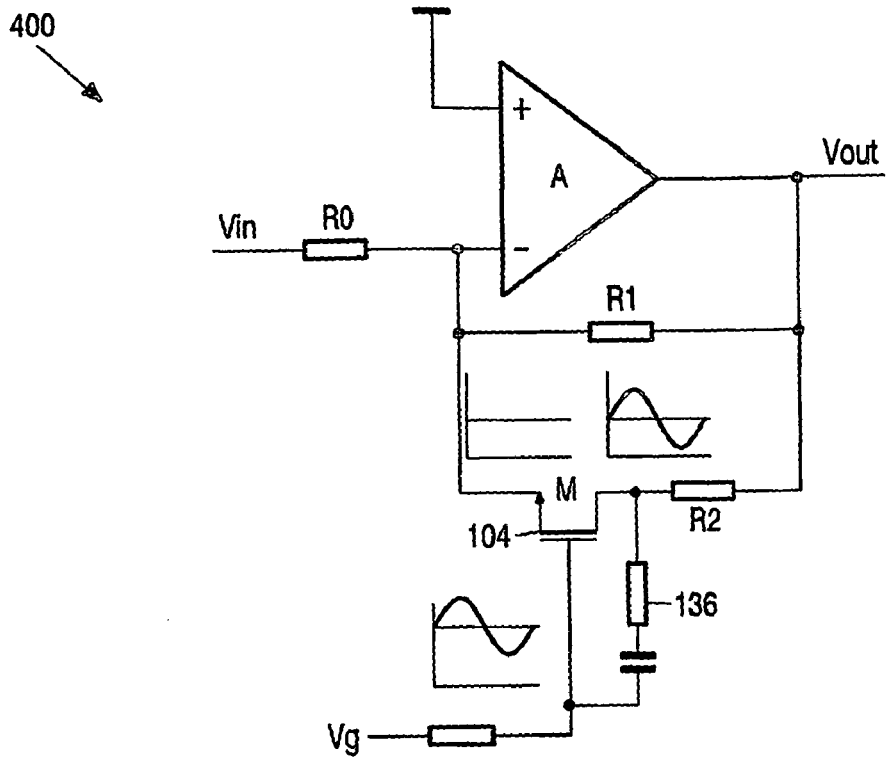
Figure 5:
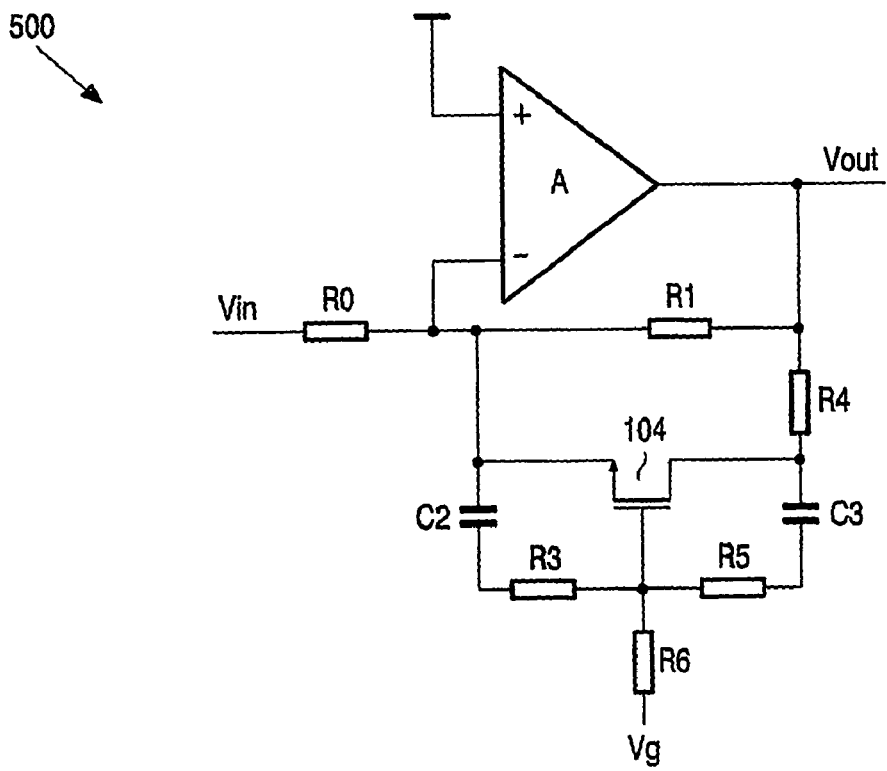
Figure 6:
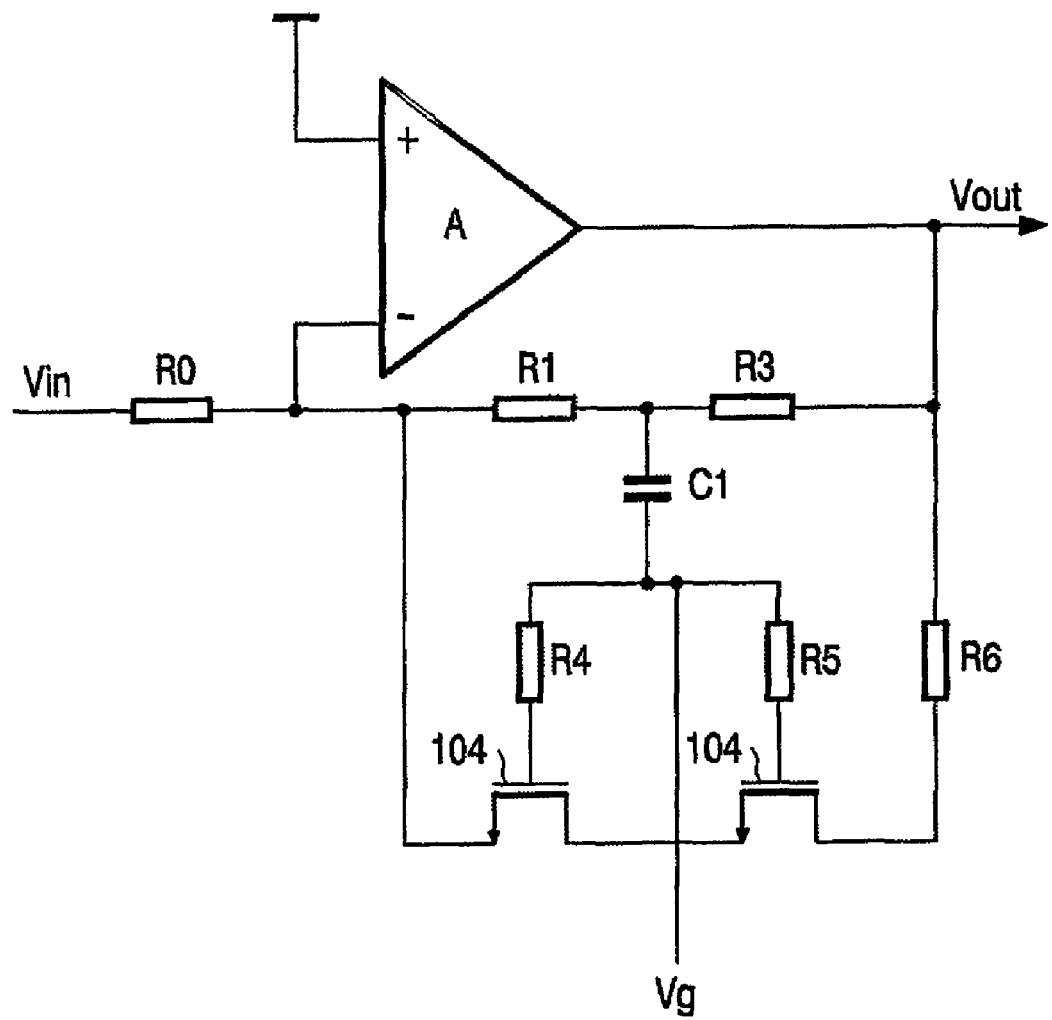

In the following, preferred embodiments of the invention are described in greater detail by making reference to the drawings in which:

FIG. 1 shows a block diagram of a variable gain amplifier having a single switch and control circuitry for providing a controlled transition between the gains, FIG. 2 shows a variable gain amplifier having multiple switches for selection of discrete gains, FIG. 3 shows an interface circuit for providing an interface between the gate of the switch of the variable gain amplifier and the control circuitry, FIG. 4 shows a variable gain amplifier with reduced modulation of the on-resistance of the MOS switch by means of a series connection of a resistor and a capacitor, FIG. 5 shows an alternative embodiment of the variable gain amplifier of FIG. 4, FIG. 6 shows a further alternative embodiment of the variable gain amplifier of FIG. 4, where the modulation signal amplitudes is divided across two MOS switches.

FIG. 1 shows a variable gain amplifier (VGA) 100. VGA 100 has operational amplifier 102 which provides the output signal Vout. The input signal Vin is coupled to the inverting input of operational amplifier 102 by means of resistor R0.

Feedback of the output signal Vout to the inverting input of operational amplifier 102 is provided by resistor R1, if MOS transitor switch 104 is in a non-conducting off-state; if MOS transitions switch 104 is in a conducting on-state, feedback is provided by R1 connected in parallel to resistor R2 and the on-resistance off MOS transistor switch 104. By controlling of the amount of feedback by means of the MOS transistor switch 104 two discrete gains of the VGA 100 are selectable for the steady state.

The non-inverting input of the operational amplifier 102 is connected to a voltage Vdc.

The gate voltage VG of MOS transistor switch 104 is provided by control circuit 106. Control 106 has generator circuit 108, reference voltage circuit 110 and reference voltage circuit 112. Generator circuit 108, reference voltage circuit 110 and reference voltage 112 have the same topology as variable gain amplifier 100 and are electrically equivalent.

The gate voltage of MOS transistor switch M1 of reference voltage circuit 110 is permanently tied to voltage VCC whereas the gate voltage of MOS transistor switch M2 of reference voltage circuit 112 is permanently tied to ground.

Reference voltage circuit 110 provides at its output reference voltage Vref 1 and reference voltage circuit 112 provides at its output reference voltage Vref 2. The reference voltages Vref 1 and Vref 2 are applied over a number N−1 of series connected resistors 114. This provides a number of N discrete voltages between the reference voltages.

Any one of those discrete voltages is selectable by a corresponding transistor switch P1, P2, P3, . . . , $P_N$. The transistor switches P1, . . . , $P_N$ are controlled by respective outputs $D_1$, $D_2$, . . . , $D_N$ of sequence generator 116. Depending on the state of the outputs $D_1$, $D_2$, . . . , $D_N$ one of the discrete voltages between the reference voltages is selected and coupled to line 118. By means of line 118, the selected discrete voltage is applied to the inverting input of operational amplifier 120. Preferably the selected discrete voltage is low pass filtered by means of low pass filter 122 before application to the inverting input of operational amplifier 120.

Operational amplifier 120 receives the output voltage Vgen of the generator circuit 108 at its non-inverting input. The output of operational amplifier 120 is the gate voltage VG which is applied to the gate of MOS transistor switch 104 and also to the gate of the equivalent MOS transistor switch M0 of the generator circuit 108. This way the generator circuit 108 is regulated such that a VG results which corresponds to the selected discrete output voltage Vref corresponding with a certain gain setting.

Sequence generator 116 has inputs 124, 126 and 128. A clock signal is applied to input 124. Input 126 is a reset input. By means of input 128, a transition between the steady states can be triggered, i.e. from high gain to low gain or the other way.

For example, VGA 100 is in a low gain steady state, i.e. VG=Vcc. When sequence generator 116 receives a trigger signal at its input 128 this triggers the controlled transition from the low gain steady state of VGA100 to its high gain steady state corresponding to VG=ground voltage.

The first element of the sequence is to switch on transistor P1 in order to select voltage Vref 1. This is done by asserting signal output $D_1$ of sequence generator 116. After a certain pre-determined time interval, for example with the next clock pulse at input 124, output $D_1$ is de-asserted and output $D_2$ is asserted in order to switch on transistor P2 for selection of a Vref which is one incremental step above Vref1. This results in a corresponding decrease of VG which is applied to the gate of MOS transistor switch 104.

After the next predetermined time interval has passed $D_2$ is de-asserted and $D_3$ is asserted in order to switch on transistor P3 for the next incremental increase of Vref. This process continues such that Vref is step wise increased from Vref1 to Vref2. This results in a corresponding change of VG such that VGA 100 transitions from its low gain steady state to its high gain steady state in a controlled way which limits transient non-linear effects and thus distortion.

FIG. 2 shows an alternative embodiment of VGA 100 with multiple MOS transistor switches 104. In the example considered here a number of nine switches is provided for course gain control and a number of ten switches is provided for fine gain control. The below table 1 shows a truth table for gate signals A to I for the coarse gain control and below table 2 is the truth table for gate signals J to S for the fine gain control.

TABLE 1

(coarse steps)

gate of the switching MOST

| Gain | A | B | C | D | E | F | G | H | I |
|---|---|---|---|---|---|---|---|---|---|
| −6 | 0 | 0 | 0 | 0 | 0 | 0 | 0 | 0 | 0 |
| −4 | 1 | 0 | 0 | 0 | 0 | 0 | 0 | 0 | 0 |
| −2 | 1 | 1 | 0 | 0 | 0 | 0 | 0 | 0 | 0 |
| 0 | 1 | 1 | 1 | 0 | 0 | 0 | 0 | 0 | 0 |
| 2 | 1 | 1 | 1 | 1 | 0 | 0 | 0 | 0 | 0 |
| 4 | 1 | 1 | 1 | 1 | 1 | 0 | 0 | 0 | 0 |
| 6 | 1 | 1 | 1 | 1 | 1 | 1 | 0 | 0 | 0 |
| 8 | 1 | 1 | 1 | 1 | 1 | 1 | 1 | 0 | 0 |
| 10 | 1 | 1 | 1 | 1 | 1 | 1 | 1 | 1 | 0 |
| 12 | 1 | 1 | 1 | 1 | 1 | 1 | 1 | 1 | 1 |

TABLE 2

(fine steps)

gate of the switching MOST

| Gain | J | K | L | M | N | O | P | Q | R | S |
|---|---|---|---|---|---|---|---|---|---|---|
| 0 | 0 | 0 | 0 | 0 | 0 | 0 | 0 | 0 | 0 | 1 |
| 0.2 | 0 | 0 | 0 | 0 | 0 | 0 | 0 | 0 | 1 | 1 |
| 0.4 | 0 | 0 | 0 | 0 | 0 | 0 | 0 | 1 | 1 | 1 |
| 0.6 | 0 | 0 | 0 | 0 | 0 | 0 | 1 | 1 | 1 | 1 |
| 0.8 | 0 | 0 | 0 | 0 | 0 | 1 | 1 | 1 | 1 | 1 |
| 1 | 0 | 0 | 0 | 0 | 1 | 1 | 1 | 1 | 1 | 1 |
| 1.2 | 0 | 0 | 0 | 1 | 1 | 1 | 1 | 1 | 1 | 1 |
| 1.4 | 0 | 0 | 1 | 1 | 1 | 1 | 1 | 1 | 1 | 1 |
| 1.6 | 0 | 1 | 1 | 1 | 1 | 1 | 1 | 1 | 1 | 1 |
| 1.8 | 1 | 1 | 1 | 1 | 1 | 1 | 1 | 1 | 1 | 1 |

In order to control the transition between two discrete gains of the VGA 100 of FIG. 2 control circuit 106 can be multiplexed in order to avoid a separate control circuit 106 for each one of the signals A to S. This can be done by means of the interface circuit 130 of FIG. 3.

In the embodiment of FIG. 3, VGA 100 of FIG. 2 is used; the gate voltages of the MOS transistor switches 104 (signals A, B, . . . , S) require transition control depending on the selected discrete gain.

Interface circuit 130 is connected to signal A of VGA 100. Interface circuit 130 has flip flop 132 for storing the current steady state of the MOS transistor 104 which is controlled by gate signal A. As there are only two alternative steady states for the current switching condition of MOS transistor switch 104, switch S2 is either connected to Vcc or to ground. This potential is coupled to signal A by means of switch S1.

The Q output of flip-flop 132 provides signal state which is coupled to sequence generator 116 (cf. FIG. 1) in order to inform sequence generator 116 of the current steady state of the VGA100. During a transition from one steady state to another, the position of switch S1 is changed such that the signal VG provided by control circuit 106 is coupled to signal A. After the transitional phase the switch S1 is moved back to its initial position; also the position of switch S2 has been changed such that the new steady state is held.

After the transition has been completed control circuit 106 can be coupled to the interface circuit 130 of signal B or another one of the signals B to S depending on the required switching operations. By providing interface circuit 130 for each one of the signals A to S control circuit 106 can be multiplexed such that the required transitions of the switching states of the MOS transistor switches 104 are sequentially accomplished.

In operation the following method is performed by means of interface circuit 130 and control circuit 106 in order to perform the quasi continuous gain transition:

coupling of the output signal VG of control circuit 106 to the VG input of interface circuit 130 and coupling of signal state of interface circuit 130 to input 128 of control circuit 106. This is accomplished by means of a multiplexer which multiplexes the output VG of control circuit 106 to the various interface circuits 130 and the state signals of the various interface circuits 130 to the signal control circuit 106 i.e. input 128, set 'enable=1' to activate interface circuit 130, reading of signal state at input 128 by sequence generator 116 (cf. FIG. 1), set the begin value of the output signal VG of the control circuit 106 to match the VG value corresponding to the current switch position as indicated by state, apply signal T1 to toggle flip-flop 134; this way the position of S1 is changed in order to select the external VG input from control circuit 106, start the stepwise transition of VG by sequentially switching on the transistors P1 to $P_N$, apply signal T1 to toggle flip-flop 134 in order to bring back switch S1 to its initial hold position. At the same time T2 is applied in order to trigger flip-flop 132 to set switch S2 to the voltage potential corresponding to the new steady state, disable interface circuit 130 by setting 'enable=0', couple control circuit 106 to the next gate signal input of a MOS transistor switch 104 requiring a transition of its switching state.

FIG. 4 shows an alternative embodiment for a variable gain amplifier 400. Like elements in FIG. 4 of variable gain amplifier 400 are designated by the same symbols as in variable gain amplifier 100 of FIG. 1.

In the embodiment of FIG. 4 the modulation of the on-resistance with twice the frequency of the input signal V in is reduced by modulating of the gate voltage of MOS transistor switch 104 with the AC signal which is present at the drain of the MOS transistor switch 104. This is accomplished by coupling the drain of transistor switch 104 to the gate by means of a series connection of resistor 136 and capacitor 138.

The AC voltage between the drain and the source depends on the on-resistance of the MOS transistor switch 104. Due to the fact that the MOS transistor switch 104 is a symmetrical device the drain and the source can be interchanged. The voltage at the gate with respect to the terminal carrying the lowest potential determines the channel on-resistance. This non-linearity is compensated by the modulation of the gate voltage.

FIG. 5 shows a possibility to further reduce this modulation by making the gate source AC voltage the average value of the voltages at drain and source. The resistors R3 and R5 are equal as well as the capacitors C2 and C3. Therefore the signal present at the gate is the average of the signals present at drain and source. This way the linearity of the variable gain amplifier 500 of FIG. 5 is further improved.

FIG. 6 shows a further embodiment for variable gain amplifier 600. In the embodiment of FIG. 6 the fixed feedback resistor is split in two R1 and R3 and the center tap is connected via capacitor C1 to the gates of MOS transistor switches 104. Transistors R4 and R5 are used to reduce the influence of parasitics.

REFERENCE NUMERALS 100 variable gain amplifier
102 operational amplifier
104 mos transistor switch
106 control circuit
108 generator circuit
110 reference voltage circuit
112 reference voltage circuit
114 resistor
116 sequence generator
118 line
120 operational amplifier
122 low-pass filter
124 input
126 input
128 input
130 interface circuit
132 flip-flop
134 flip-flop
136 resistor
138 capacitor
400 variable gain amplifier
500 variable gain amplifier
600 variable gain amplifier

The invention claimed is:

1. A method of controlling a variable gain amplifier having at least one semiconductor switch, the amplifier having a first gain when the semiconductor switch is in a first steady state and a first gate voltage is applied to the semiconductor switch, and the amplifier having a second gain when the semiconductor switch is in a second steady state and a second gate voltage is applied to the semiconductor switch, whereby a sequence of third gate voltages is applied to the semiconductor switch to transition between the first and second gains.

2. The method of claim 1, further comprising generating a stepped signal sequence and low pass filtering of the stepped signal sequence to obtain the sequence of third gate voltages.

3. The method of claim 1, the variable gain amplifier having a set of semiconductor switches, further comprising selecting a sub-set of the set of semiconductor switches, and applying a sequence of third gate voltages to each one of the semiconductor switches of the sub-set.

4. The method of claim 1, further comprising modulating of the gate voltages by means of an alternating drain signal component.

5. An electronic circuit comprising a variable gain amplifier (100;400; 500; 600) having at least one semiconductor switch (104), the amplifier having a first gain when the semiconductor switch is in a first steady state and a first gain voltage is applied to the semiconductor switch, and the amplifier having a second gain when the semiconductor switch is in a second steady state and a second gate voltage is applied to the semiconductor switch, and control means (106, 130) for applying a sequence of third gate voltages to transition between the first an second gains.

6. The electronic circuit of claim 5, further comprising means (116) for generating a stepped signal sequence an means (122) for low pass filtering of the stepped signal sequence in order to obtain the sequence of third gain voltages.

7. The electronic circuit of claim 5, further comprising a gate voltage generator circuit (108), a first (110) and a second (112) reference voltage circuit, the gate voltage generator circuit, the first and the second reference voltage circuits being equivalent to the variable gain amplifier, the first gate voltage being applied to the gate of the semiconductor switch of the first reference voltage circuit and the second gate voltage being applied to the gate of the semiconductor switch of the second reference voltage circuit to provide first and second reference voltages, respectively, and sequence generator means (116) for generating a sequence of voltages transitioning between the first and the second voltage references, the gate voltage generator circuit being controlled by the sequence of voltages provided by the sequence generator means to produce the sequence of third gate voltages.

8. The electronic circuit of claims 5, having first ones of the semiconductor switches for coarse gain selection and having second ones of the semiconductor switches for fine gain selection.

9. The electronic circuit of claim 5, further comprising means for multiplexing of the control means for applying the sequence of third gate voltages between the semiconductor switches in order to enable a sequential transition of the semiconductor switches between respective first and second steady states.

10. The electronic circuit of claim 5, further comprising an interface circuit (130) between the gate of the semiconductor switch and the control means, the interface circuit having a memory for storing of the present steady state of the semiconductor switch and for providing a state signal of the present steady state of the semiconductor switch to the control means.

11. The electronic circuit of claim 5, further comprising means (136) for modulating the gate voltages by means of an alternating drain signal component.

12. The electronic circuit of claim 11, the means for modulating for the gate voltages comprising a resistor (136) being connected in series with a capacitor, the series connection of the resister and the capacitor coupling the drain and the source of the semiconductor switch.

13. The electronic circuit of claim 11, the means for modulating of the gate voltages being adapted to bring an alternating current voltage component of the gate-source voltage of the semiconductor switch to the average values of the gain and source voltages of the semiconductor switch.

14. The electronic circuit of claim 13, a first series connection of a capacitor and a resistor being coupled between the gates and the drain of the semiconductor switch and a second series connection of a resistor and a capacitor being coupled between the gates and the source of the semiconductor switch.

15. The electronic circuit of claim 11, the means for modulating of the gate voltages being adapted to divide the modulating signal amplitude across several semiconductor switches.

* * * * *